United States Patent
Melanson

(10) Patent No.: US 7,696,913 B2
(45) Date of Patent: *Apr. 13, 2010

(54) SIGNAL PROCESSING SYSTEM USING DELTA-SIGMA MODULATION HAVING AN INTERNAL STABILIZER PATH WITH DIRECT OUTPUT-TO-INTEGRATOR CONNECTION

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/865,036

(22) Filed: Sep. 30, 2007

(65) Prior Publication Data

US 2008/0272946 A1 Nov. 6, 2008

Related U.S. Application Data

(60) Provisional application No. 60/915,547, filed on May 2, 2007.

(51) Int. Cl.
*H03M 3/00* (2006.01)
(52) U.S. Cl. .................. 341/143; 341/155; 341/156
(58) Field of Classification Search .......... 341/155, 341/143, 156; 708/819
See application file for complete search history.

(56) References Cited

U.S. PATENT DOCUMENTS 4,414,493 A 11/1983 Henrich
4,677,366 A 6/1987 Wilkinson et al.
4,797,633 A 1/1989 Humphrey
4,940,929 A 7/1990 Williams
4,973,919 A 11/1990 Allfather (Continued)

FOREIGN PATENT DOCUMENTS

EP 1014563 6/2000

(Continued)

OTHER PUBLICATIONS

D. Hausman, Lutron, RTISS-TE Operation, Real-Time Illumination Stability Systems for Trailing-Edge (Reverse Phase Control) Dimmers, v. 1.0 Dec. 2004.

(Continued)

*Primary Examiner*—Jean B Jeanglaude
(74) *Attorney, Agent, or Firm*—Hamilton & Terrile, LLP; Kent B. Chambers

(57) ABSTRACT

A signal processing system includes an analog-to-digital delta sigma modulator with a duty cycle modulator and a finite impulse response (FIR) filter in a main loop feedback path of the delta sigma modulator. The duty cycle modulator and FIR filter can provide high performance filtering in the main loop feedback path. To prevent instability in the main loop caused by the duty cycle modulator and FIR filter, the delta sigma modulator also includes a stabilizer loop. Transfer functions of the main loop and the stabilizer loop combine to achieve a target transfer function for the analog-to-digital delta sigma modulator that provides for stable operation of the analog-to-digital delta sigma modulator. In at least one embodiment, the stabilizer loop includes a stabilizer path that provides output data directly to an integrator of the main loop filter.

23 Claims, 12 Drawing Sheets

U.S. PATENT DOCUMENTS

| | | | |
|---|---|---|---|
| 5,278,490 A | 1/1994 | Smedley | |
| 5,323,157 A | 6/1994 | Ledzius et al. | |
| 5,359,180 A | 10/1994 | Park et al. | |
| 5,477,481 A * | 12/1995 | Kerth | 708/819 |
| 5,481,178 A | 1/1996 | Wilcox et al. | |
| 5,565,761 A | 10/1996 | Hwang | |
| 5,747,977 A | 5/1998 | Hwang | |
| 5,783,909 A | 7/1998 | Hochstein | |
| 5,963,086 A | 10/1999 | Hall | |
| 5,994,885 A | 11/1999 | Wilcox et al. | |
| 6,016,038 A | 1/2000 | Mueller et al. | |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,150,774 A | 11/2000 | Mueller et al. | |
| 6,211,626 B1 | 4/2001 | Lys et al. | |
| 6,211,627 B1 | 4/2001 | Callahan | |
| 6,229,271 B1 | 5/2001 | Liu | |
| 6,246,183 B1 | 6/2001 | Buonavita | |
| 6,259,614 B1 | 7/2001 | Ribarich et al. | |
| 6,304,066 B1 | 10/2001 | Wilcox et al. | |
| 6,304,473 B1 | 10/2001 | Telefus et al. | |
| 6,344,811 B1 | 2/2002 | Melanson | |
| 6,445,600 B2 | 9/2002 | Ben-Yaakov | |
| 6,509,913 B2 | 1/2003 | Martin, Jr. et al. | |
| 6,580,258 B2 | 6/2003 | Wilcox et al. | |
| 6,583,550 B2 | 6/2003 | Iwasa et al. | |
| 6,636,003 B2 | 10/2003 | Rahm et al. | |
| 6,713,974 B2 | 3/2004 | Patchornik et al. | |
| 6,727,832 B1 | 4/2004 | Melanson | |
| 6,741,123 B1 | 5/2004 | Anderson et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,860,628 B2 | 3/2005 | Robertson et al. | |
| 6,870,325 B2 | 3/2005 | Bushell et al. | |
| 6,882,552 B2 | 4/2005 | Telefus et al. | |
| 6,888,322 B2 | 5/2005 | Dowling et al. | |
| 6,940,733 B2 | 9/2005 | Schie et al. | |
| 6,944,034 B1 | 9/2005 | Shytenberg et al. | |
| 6,956,750 B1 | 10/2005 | Eason et al. | |
| 6,967,448 B2 | 11/2005 | Morgan et al. | |
| 6,970,503 B1 | 11/2005 | Kalb | |
| 6,975,079 B2 | 12/2005 | Lys et al. | |
| 7,064,498 B2 | 6/2006 | Dowling et al. | |
| 7,088,059 B2 | 8/2006 | McKinney et al. | |
| 7,102,902 B1 | 9/2006 | Brown et al. | |
| 7,109,791 B1 | 9/2006 | Epperson et al. | |
| 7,135,824 B2 | 11/2006 | Lys et al. | |
| 7,145,295 B1 | 12/2006 | Lee et al. | |
| 7,161,816 B2 | 1/2007 | Shytenberg et al. | |
| 7,183,957 B1 * | 2/2007 | Melanson | 341/143 |
| 7,221,130 B2 | 5/2007 | Ribeiro et al. | |
| 7,255,457 B2 | 8/2007 | Ducharm et al. | |
| 7,266,001 B1 | 9/2007 | Notohamiprodjo et al. | |
| 7,292,013 B1 | 11/2007 | Chen et al. | |
| 2002/0145041 A1 | 10/2002 | Muthu et al. | |
| 2002/0166073 A1 | 11/2002 | Nguyen et al. | |
| 2003/0223255 A1 | 12/2003 | Ben-Yaakov et al. | |
| 2004/0085030 A1 | 5/2004 | Laflamme et al. | |
| 2004/0085117 A1 | 5/2004 | Melbert et al. | |
| 2004/0169477 A1 | 9/2004 | Yanai et al. | |
| 2004/0227571 A1 | 11/2004 | Kuribayashi | |
| 2004/0228116 A1 | 11/2004 | Miller et al. | |
| 2004/0239262 A1 | 12/2004 | Ido et al. | |
| 2005/0156770 A1 | 7/2005 | Melanson | |
| 2005/0184895 A1 | 8/2005 | Petersen | |
| 2005/0253533 A1 | 11/2005 | Lys et al. | |
| 2005/0275354 A1 | 12/2005 | Hausman, Jr. et al. | |
| 2006/0022916 A1 | 2/2006 | Aiello | |
| 2006/0023002 A1 | 2/2006 | Hara et al. | |
| 2006/0125420 A1 | 6/2006 | Boone et al. | |
| 2006/0226795 A1 | 10/2006 | Walter et al. | |
| 2006/0261754 A1 | 11/2006 | Lee | |
| 2007/0029946 A1 | 2/2007 | Yu et al. | |
| 2007/0040512 A1 | 2/2007 | Jungwirth et al. | |
| 2007/0053182 A1 | 3/2007 | Robertson | |
| 2007/0182699 A1 | 8/2007 | Ha et al. | |

FOREIGN PATENT DOCUMENTS

| | | |
|---|---|---|
| EP | 1164819 A | 12/2001 |
| EP | 1213823 A2 | 6/2002 |
| EP | 1528785 A | 5/2005 |
| WO | 01/97384 A | 12/2001 |
| WO | WO0197384 A2 | 12/2001 |
| WO | 0227944 | 4/2002 |
| WO | 02/091805 A2 | 11/2002 |
| WO | 2006/067521 A | 6/2006 |
| WO | WO2006135584 | 12/2006 |
| WO | 2007/026170 A | 3/2007 |
| WO | 2007/079362 A | 7/2007 |
| WO | WO2007079632 A1 | 7/2007 |

OTHER PUBLICATIONS

International Rectifier, Data Sheet No. PD60230 revC, IR1150(S)(PbF), uPFC One Cycle Control PFC IC Feb. 5, 2007.

Texas Instruments, Application Report SLUA308, UCC3817 Current Sense Transformer Evaluation, Feb. 2004.

Texas Instruments, Application Report SPRA902A, Average Current Mode Controlled Power Factor Correctiom Converter using TMS320LF2407A, Jul. 2005.

Unitrode, Design Note DN-39A, Optimizing Performance in UC3854 Power Factor Correction Applications, Nov. 1994.

Fairchild Semiconductor, Application Note 42030, Theory and Application of the ML4821 Average Current Mode PFC Controller, Aug. 1997.

Fairchild Semiconductor, Application Note AN4121, Design of Power Factor Correction Circuit Using FAN7527B, Rev.1.0.1, May 30, 2002.

Fairchild Semiconductor, Application Note 6004, 500W Power-Factor-Corrected (PFC) Converter Design with FAN4810, Rev. 1.0.1, Oct. 31, 2003.

Fairchild Semiconductor, FAN4822, ZVA Average Current PFC Controller, Rev. 1.0.1 Aug. 10, 2001.

Fairchild Semiconductor, ML4821, Power Factor Controller, Rev. 1.0.2, Jun. 19, 2001.

Fairchild Semiconductor, ML4812, Power Factor Controller, Rev. 1.0.4, May 31, 2001.

Linear Technology, 100 Watt LED Driver, undated.

Fairchild Semiconductor, FAN7544, Simple Ballast Controller, Rev. 1.0.0.

Fairchild Semiconductor, FAN7532, Ballast Controller, Rev. 1.0.2.

Fairchild Semiconductor, FAN7711, Ballast Control IC, Rev. 1.0.2.

Fairchild Semiconductor, KA7541, Simple Ballast Controller, Rev. 1.0.3.

ST Microelectronics, L6574, CFL/TL Ballast Driver Preheat and Dimming, Sep. 2003.

ST Microelectronics, AN993, Application Note, Electronic Ballast with PFC Using L6574 and L6561, May 2004.

International Search Report and Written Opinion for PCT/US2008/062384 dated Jan. 14, 2008.

S. Dunlap et al., Design of Delta-Sigma Modulated Switching Power Supply, Circuits & Systems, Proceedings of the 1998 IEEE International Symposium, 1998.

Infineon, CCM-PFC Standalone Power Factor Correction (PFC) Controller in Continuous Conduction Mode (CCM), Version 2.1, Feb. 6, 2007.

International Rectifier, IRAC1150-300W Demo Board, User's Guide, Rev. 3.0, Aug. 2, 2005.

International Rectifier, Application Note AN-1077,PFC Converter Design with IR1150 One Cycle Control IC, rev. 2.3, Jun. 2005.

International Rectifier, Data Sheet PD60230 revC, Feb. 5, 2007.

Lu et al., International Rectifier, Bridgeless PFC Implementation Using One Cycle Control Technique, 2005.

Linear Technology, LT1248, Power Factor Controller, Apr. 20, 2007.

On Semiconductor, AND8123/D, Power Factor Correction Stages Operating in Critical Conduction Mode, Sep. 2003.

On Semiconductor, MC33260, GreenLine Compact Power Factor Controller: Innovative Circuit for Cost Effective Solutions, Sep. 2005.

On Semiconductor, NCP1605, Enhanced, High Voltage and Efficient Standby Mode, Power Factor Controller, Feb. 2007.

On Semconductor, NCP1606, Cost Effective Power Factor Controller, Mar. 2007.

On Semiconductor, NCP1654, Product Review, Power Factor Controller for Compact and Robust, Continuous Conduction Mode Pre-Converters, Mar. 2007.

Philips, Application Note, 90W Resonant SMPS with TEA1610 SwingChip, AN99011, 1999.

NXP, TEA1750, GreenChip III SMPS control IC Product Data Sheet, Apr. 6, 2007.

Renesas, HA16174P/FP, Power Factor Correction Controller IC, Jan. 6, 2006.

Renesas Technology Releases Industry's First Critical-Conduction-Mode Power Factor Correction Control IC Implementing Interleaved Operation, Dec. 18, 2006.

Renesas, Application Note R2A20111 EVB, PFC Control IC R2A20111 Evaluation Board, Feb. 2007.

Stmicroelectronics, L6563, Advanced Transition-Mode PFC Controller, Mar. 2007.

Texas Instruments, Application Note SLUA321, Startup Current Transient of the Leading Edge Triggered PFC Controllers, Jul. 2004.

Texas Instruments, Application Report, SLUA309A, Avoiding Audible Noise at Light Loads when using Leading Edge Triggered PFC Converters, Sep. 2004.

Texas Instruments, Application Report SLUA369B, 350-W, Two-Phase Interleaved PFC Pre-Regulator Design Review, Mar. 2007.

Unitrode, High Power-Factor Preregulator, Oct. 1994.

Texas Instruments, Transition Mode PFC Controller, SLUS515D, Jul. 2005.

Unitrode Products from Texas Instruments, Programmable Output Power Factor Preregulator, Dec. 2004.

Unitrode Products from Texas Instruments, High Performance Power Factor Preregulator, Oct. 2005.

Texas Instruments, UCC3817 BiCMOS Power Factor Preregulator Evaluation Board User's Guide, Nov. 2002.

Unitrode, L. Balogh, Design Note UC3854A/B and UC3855A/B Provide Power Limiting with Sinusoidal Input Current for PFC Front Ends, SLUA196A, Nov. 2001.

A. Silva De Morais et al., A High Power Factor Ballast Using a Single Switch with Both Power Stages Integrated, IEEE Transactions on Power Electronics, vol. 21, No. 2, Mar. 2006.

M. Ponce et al., High-Efficient Integrated Electronic Ballast for Compact Fluorescent Lamps, IEEE Transactions on Power Electronics, vol. 21, No. 2, Mar. 2006.

A. R. Seidel et al., A Practical Comparison Among High-Power-Factor Electronic Ballasts with Similar Ideas, IEEE Transactions on Industry Applications, vol. 41, No. 6, Nov.-Dec. 2005.

F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.

J. A. Vilela Jr. et al., An Electronic Ballast with High Power Factor and Low Voltage Stress, IEEE Transactions on Industry Applications, vol. 41, No. 4, Jul./Aug. 2005.

S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.

M. K. Kazimierczuk et al., Electronic Ballast for Fluorescent Lamps, IEEE Transactions on Power Electronics, vol. 8, No. 4, Oct. 1993.

S. Ben-Yaakov et al., Statics and Dynamics of Fluorescent Lamps Operating at High Frequency: Modeling and Simulation, IEEE Transactions on Industry Applications, vol. 38, No. 6, Nov./Dec. 2002.

H. L. Cheng et al., A Novel Single-Stage High-Power-Factor Electronic Ballast with Symmetrical Topology, IEEE Transactions on Power Electronics, vol. 50, No. 4, Aug. 2003.

J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.

Q. Li et al., An Analysis of the ZVS Two-Inductor Boost Converter under Variable Frequency Operation, IEEE Transactions on Power Electronics, vol. 22, No. 1, Jan. 2007.

H. Peng et al., Modeling of Quantization Effects in Digitally Controlled DC-DC Converters, IEEE Transactions on Power Electronics, vol. 22, No. 1, Jan. 2007.

G. Yao et al., Soft Switching Circuit for Interleaved Boost Converters, IEEE Transactions on Power Electronics, vol. 22, No. 1, Jan. 2007.

C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.

W. Zhang et al., A New Duty Cycle Control Strategy for Power Factor Correction and FPGA Implementation, IEEE Transactions on Power Electronics, vol. 21, No. 6, Nov. 2006.

H. Wu et al., Single Phase Three-Level Power Factor Correction Circuit with Passive Lossless Snubber, IEEE Transactions on Power Electronics, vol. 17, No. 2, Mar. 2006.

O. Garcia et al., High Efficiency PFC Converter to Meet EN61000-3-2 and A14, Proceedings of the 2002 IEEE International Symposium on Industrial Electronics, vol. 3, 2002.

P. Lee et al., Steady-State Analysis of an Interleaved Boost Converter with Coupled Inductors, IEEE Transactions on Industrial Electronics, vol. 47, No. 4, Aug. 2000.

D.K.W. Cheng et al., A New Improved Boost Converter with Ripple Free Input Current Using Coupled Inductors, Power Electronics and Variable Speed Drives, Sep. 21-23, 1998.

B.A. Miwa et al., High Efficiency Power Factor Correction Using Interleaved Techniques, Applied Power Electronics Conference and Exposition, Seventh Annual Conference Proceedings, Feb. 23-27, 1992.

Z. Lai et al., A Family of Power-Factor-Correction Controllers, Twelfth Annual Applied Power Electronics Conference and Exposition, vol. 1, Feb. 23-27, 1997.

L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7-11, 1993.

Fairchild Semiconductor, Application Note 42030, Theory and Application of the ML4821 Average Current Mode PFC Controller, Oct. 25, 2000.

Unitrode Products From Texas Instruments, BiCMOS Power Factor Preregulator, Feb. 2006.

Freescale Semiconductor, Inc., Dimmable Light Ballast with Power Factor Correction, Design Reference Manual, DRM067, Rev. 1, Dec. 2005.

J. Zhou et al., Novel Sampling Algorithm for DSP Controlled 2 kW PFC Converter, IEEE Transactions on Power Electronics, vol. 16, No. 2, Mar. 2001.

A. Prodic, Compensator Design and Stability Assessment for Fast Voltage Loops of Power Factor Correction Rectifiers, IEEE Transactions on Power Electronics, vol. 22, No. 5, Sep. 2007.

M. Brkovic et al., "Automatic Current Shaper with Fast Output Regulation and Soft-Switching," S.15.C Power Converters, Telecommunications Energy Conference, 1993.

Dallas Semiconductor, Maxim, "Charge-Pump and Step-Up DC-DC Converter Solutions for Powering White LEDs in Series or Parallel Connections," Apr. 23, 2002.

Freescale Semiconductor, AN3052, Implementing PFC Average Current Mode Control Using the MC9S12E128, Nov. 2005.

D. Maksimovic et al., "Switching Converters with Wide DC Conversion Range," Institute of Electrical and Electronic Engineer's (IEEE) Transactions on Power Electronics, Jan. 1991.

V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.

S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.

K. Leung et al., "Dynamic Hysteresis Band Control of the Buck Converter with Fast Transient Response," IEEE Transactions on Circuits and Systems—II: Express Briefs, vol. 52, No. 7, Jul. 2005.

Y. Ohno, Spectral Design Considerations for White LED Color Rendering, Final Manuscript, Optical Engineering, vol. 44, 111302 (2005).

S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.

J. Turchi, Four Key Steps to Design a Continuous Conduction Mode PFC Stage Using the NCP1653, On Semiconductor, Publication Order No. AND184/D, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Simmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004.

M. Radecker et al., Application of Single-Transistor Smart-Power IC for Fluorescent Lamp Ballast, Thirty-Fourth Annual Industry Applications Conference IEEE, vol. 1, Oct. 3-7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

International Search Report for PCT/US2008/051072, mailed Jun. 4, 2008.

International Search Report and Written Opinion for PCT/US2008/062398 dated Aug. 25, 2008.

"HV9931 Unity Power Factor LED Lamp Driver, Initial Release" 2005, Supertex Inc., Sunnyvale, CA USA.

"AN-H52 Application Note: "HV9931 Unity Power Factor Led Lamp Driver Mar. 7, 2007, Supertex Inc., Sunnyvale, CA, USA.

Dustin Rand et al: "Issues, Models and Solutions for Triac Modulated Phase Dimming of LED Lamps" Power Electronics Specialists Conference, 2007. PESC 2007, IEEE, IEEE, P1, Jun. 1, 2007, pp. 1398-1404.

Spiazzi G et al: "Analysis of a High-Power-Factor Electronic Ballast for High Brightness Light Emitting Diodes" Power Electronics Specialists, 2005 IEEE 36TH Conference on June 12, 2005, Piscatawa, NJ USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.

International Search Report PCT/US2008/062398 dated Feb. 5, 2008.

Partial International Search PCT/US2008/062387 dated Feb. 5, 2008.

Noon, Jim "UC3855A/B High Performance Power Factor Preregulator", Texas Instruments, SLUA146A, May, 1996, Revised Apr. 2004.

"High Performance Power Factor Preregulator", Unitrode Products from Texas Instruments, SLUS382B, Jun. 1998, Revised Oct. 2005.

International Search Report PCT/GB2006/003259 dated Jan. 12, 2007.
Written Opinion of the International Searching Authority PCT/US2008/056739.
International Search Report PCT/US2008/056606 dated Dec. 3, 2008.
Written Opinion of the International Searching Authority PCT/US2008/056606 dated Dec. 3, 2008.
International Search Report PCT/US2008/056608 dated Dec. 3, 2008.
Written Opinion of the International Searching Authority PCT/US2008/056608 dated Dec. 3, 2008.
International Search Report PCT/GB2005/050228 dated Mar. 14, 2006.
International Search PCT/US2008/062387 dated Jan. 10, 2008.
Data Sheet LT3496 Triple Output LED Driver, 2007, Linear Technology Corporation, Milpitas, CA.
News Release, Triple Output LED, LT3496.

* cited by examiner

SIGNAL PROCESSING SYSTEM USING DELTA-SIGMA MODULATION HAVING AN INTERNAL STABILIZER PATH WITH DIRECT OUTPUT-TO-INTEGRATOR CONNECTION

CROSS-REFERENCE TO RELATED APPLICATION

This application claims the benefit under 35 U.S.C. §119 (e) and 37 C.F.R. §1.78 of U.S. Provisional Application No. 60/915,547, filed May 2, 2007, and entitled "Power Factor Correction (PFC) Controller Apparatuses and Methods."

BACKGROUND OF THE INVENTION

1. Field of the Invention

The present invention relates in general to the field of information processing, and more specifically to a system and method for stabilizing an analog-to-digital converter delta sigma modulator using an internal stabilizer path having a direct output-to-integrator of loop filter connection.

2. Description of the Related Art

Many electronic systems employ signal processing technology to process analog, digital, or a mix of analog and digital signals. In audio applications, an analog-to-digital conversion process often involves oversampling a signal, modulating the signal using a delta-sigma modulator to shape noise associated with quantizing the signal, and filtering the delta sigma modulator output with a digital filter. The filtered output signal used in a variety of ways, such as stored as digital data, transmitted, or used to subsequently produce an analog signal suitable for driving a load such as a speaker.

Delta-sigma modulators receive an input signal and convert the signal into a series of low resolution pulses having an average amplitude over time proportional to the input signal. In the process of producing a modulated output signal, delta-sigma modulators introduce quantization noise into the modulated input signal. However, the quantization noise advantageously resides outside of the audio baseband where frequency components of interest reside, i.e. between about 0 Hz and above about 20-25 kHz. Thus, in an audio context, "in-band" refers to frequencies between 0 Hz and about 20-25 kHz, and out-of-band frequencies refer to frequencies above the maximum in-band frequency. "Delta-sigma modulators" are also commonly referred to using other interchangeable terms such as "sigma-delta modulators", "delta-sigma converters", "sigma delta converters", "data converters", "noise shapers", as well as full and partial combinations of the foregoing terms.

FIG. 1 depicts a conventional topology of an analog-to-digital converter (ADC) 100 that converts input signal, $V_{in}$, into a digital output signal, D. The quantizer 108 of ADC delta sigma modulator 101 quantizes the output signal L(z) of loop filter 106 to generate an M-bit quantizer output signal Y corresponding to input signal $V_{in}$. "M" is an integer greater than zero and represents the number of bits used by quantizer 108 to quantize the output signal L(z) of loop filter 106 The ADC delta sigma modulator 100 represents output signal Y as a series of low resolution pulses whose average value over time represents delta sigma modulator input signal $V_{in}$. In a one-bit delta sigma modulator, the quantizer 108 quantizes the output signal of filter 106 as either a logical +1 or −1, and multi-bit quantizers use multiple bits to quantize the output signal of filter 106. The delta sigma modulator 100 includes an adder 102 to add the input signal $V_{in}$ to a negative of an analog feedback signal, $V_{fb}$. Delta sigma modulator 100 includes a delay element represented by $z^{-1}$ in a feedback loop to feed back output signal $Y \cdot z^{-1}$ (Y(n−1) in the time domain) to DAC 104. The analog feedback signal $V_{fb}$ represents the output of a digital-to-analog converter (DAC) 104. The summer 102 adds $V_{in}$ and $(-V_{fb})$ to determine a difference signal, $V_{diff}$, i.e. $V_{diff}=V_{in}-V_{fb}$. In at least one embodiment, summer 102 is a node of loop filter 106 connected to a parallel resistor array that received the input signal $V_{in}$ and feedback signal $f_b$. Loop filter 106 with a transfer function H(z) filters difference signal, $V_{diff}$, to shift quantization noise signals out of the baseband, e.g. 0 Hz to 20 kHz for audio applications. In one embodiment, filter 106 includes N, series connected integrators and a feedforward summer, where N is an integer greater than or equal to 1. A digital filter 110 processes the output signal Y to provide a multi-bit output at a lower rate than the operational rate of ADC delta sigma modulator 100 by filtering out out-of-band noise.

The quantizer 108 produces a quantization error E(z), which represents noise produced by the delta sigma modulator 100. The $N^{th}$ order delta sigma modulator output signal Y can be defined in terms of the input signal $V_{in}$ and a quantization error E(z), the STF, and the NTF as set forth in the z-domain Equation [1]:

$$Y(z)=STF(z) \cdot V_{in}(z)+NTF(z) \cdot E(z) \quad [1].$$

Delta sigma modulators can be implemented using a vast array of configurations that are well discussed extensively in the literature such as *Delta Sigma Data Converters—Theory, Design, and Simulation*, Norsworthy, Schreier, and Temes, IEEE Press (1997) and *Understanding Delta-Sigma Data Converters*, Schreier and Temes, IEEE Press (2005).

FIG. 2 depicts a digital-to-analog converter (DAC) signal processing system 200 described in commonly assigned U.S. Pat. No. 6,727,832, entitled "Data Converters with Digitally Filtered Pulse Width Modulation Output Stages and Methods and Systems Using the Same", with the same inventor John L. Melanson. DAC signal processing system 200 converts an input signal 202 generated by signal source 204 into an output signal 208. The signal source 204 can be any data signal source such as a compact disk player, a digital versatile disk player, and other audio signal sources. The input signal 202 generally undergoes pre-processing by preprocessor 206. In an audio system context, in preparation for processing by delta sigma modulator 210, pre-processing generally involves over-sampling input signal 202. Thus, for an audio signal sampled at 48 kHz and an oversampling ratio of 128:1, pre-processor 206 generates an input signal x(n) ("X(z)" in the z-domain) with a sampling frequency of 6.144 MHz.

The delta sigma modulator 200 includes an M-bit quantizer 212 that quantizes an output signal L(z) of loop filter 214 and generates an output signal Y(z). The delta sigma modulator 210 also has a signal transfer function (STF) and a noise transfer function (NTF) to process output signal $Y(z) \cdot z^{-1}$ and the input signal X(z). "$z^{-1}$" represents a delay of one clock cycle in the z-domain. The output signal Y(z) generally relates to the input signal X(z) and quantization error E(z) in accordance with Equation [1], which is reproduced below for convenience:

$$Y(z)=STF(z) \cdot Vin(z)+NTF(z) \cdot E(z) \quad [1].$$

Post-processor 216 includes pulse width modulator 218 and a low pass finite impulse response (FIR) filter 220 to drive out-of-band noise to a low level. In at least one embodiment, FIR filter 220 is a comb type filter or the convolution of two or more comb filters. At least one embodiment of the combination of a pulse width modulator 218 and FIR filter 220 is described in U.S. Pat. Nos. 6,727,832, 6,150,969, and 5,815, 102, inventor John L. Melanson, which are hereby incorporated by reference in their entirety. In at least one embodiment, the transfer function of FIR filter 220 is designed as a low-pass filter to provide zeros at of out-of-band frequencies with non-trivial amplitudes. For example, in at least one embodiment, the transfer function of FIR filter 220 provides zeros at frequencies corresponding to operational frequencies and corresponding harmonic frequencies of the pulse width modulator 218. The combination of pulse width modulator 218 and FIR filter 220 produces an output signal 116 with high accuracy and low out-of-band noise. Thus, the output signal 116 exhibits low sensitivity to jitter and to convolution with system noise.

It would be desirable to include the filtering capabilities of the pulse width modulator 218 and FIR filter 220 combination in the feedback loop of an ADC delta sigma modulator to filter the output signal of DAC 104 of FIG. 1. However, many features of digital-to-analog converter (DAC) delta sigma modulators do not necessarily translate well into analog-to-digital converter delta sigma modulator. For example, the pulse width modulator 218 and FIR filter 220 combination include delays, such as delays caused by the length of the response of pulse width modulator 218 and delays inherent in FIR filter 220. Such delays can cause an ADC delta sigma modulator to become unstable.

SUMMARY OF THE INVENTION

In one embodiment of the present invention, a signal processing system includes an analog-to-digital converter. The analog-to-digital converter includes a main loop filter having a transfer function $H_{MAIN}$. The main loop filter includes a signal input to receive an input signal, a quantizer, and a first digital-to-analog converter coupled to an output of the quantizer, the first digital-to-analog converter comprising a duty cycle modulator. The main loop filter also includes a finite impulse response filter coupled to an output of the first digital-to-analog converter and an integrator coupled to the signal input, to an output of the finite impulse response filter, and to an input of the quantizer. The analog-to-digital converter also includes a second integrator coupled between the first integrator and the quantizer and a stabilizer loop. The stabilizer loop has a transfer function $H_{ST}$, and the stabilizer loop includes a stabilizer path. The stabilizer path includes an input coupled to an output of the quantizer and having an output connected directly to an input of the second integrator, the stabilizer path having a transfer function $H_{ST}$. A target transfer function of the analog-to-digital converter is $H_T$, and transfer function $H_T$ comprises a combination of transfer functions $H_{MAIN}$ and $H_{ST}$.

In another embodiment of the present invention, a signal processing system includes an analog-to-digital converter having a target transfer function of $H_T$. The analog-to-digital converter includes a delta sigma modulator. The delta sigma modulator includes a quantizer to generate quantizer output data and a main loop filter to process input data and quantization feedback data in accordance with a transfer function $H_{MAIN}$. The main loop filter includes components for receiving the input data, generating the quantization feedback data from quantizer output data using (i) pulse width modulation to generate pulse width modulated output data and (ii) finite impulse response filtering of the pulse width modulated output data, combining the input signal with the quantization feedback data to generate an input_feedback signal, and processing the input_feedback signal using at least one integrator. The delta sigma modulator also includes an integrator coupled to the quantizer and a stabilizer loop having a transfer function $H_{ST}$. The stabilizer loop includes a stabilizer path. The stabilizer path is connected to the integrator to process the quantizer output data. The stabilizer path includes components to receive the quantizer output data to generate stabilizer path output data and supply the stabilizer path output data directly to the integrator. The target transfer function $H_T$ comprises a combination of transfer functions $H_{MAIN}$ and $H_{ST}$.

In a further embodiment of the present invention, a method for converting an analog input signal into a digital signal includes converting the analog input signal into a digital output signal using a delta sigma modulator having a target transfer function $H_T$, wherein the delta sigma modulator includes a main loop having a transfer function $H_{MAIN}$ and a stabilizer path having a transfer function $H_{ST}$. The target transfer function $H_T$ includes a combination of transfer functions $H_{MAIN}$ and $H_{ST}$. Converting the analog input signal includes determining a first signal from the analog input signal using a main loop of a delta sigma modulator, wherein the main loop includes (i) a quantizer feedback path comprising a duty cycle modulator coupled to a first finite impulse response filter and (ii) a signal path comprising an integrator. Converting the analog input signal further includes determining a stabilizer signal using the stabilizer loop of the delta sigma modulator, wherein the stabilizer loop includes a stabilizer path coupled across a quantizer of the delta sigma modulator and the stabilizer path includes a digital-to-analog converter and an output connected directly to the integrator of the main loop. Converting the analog input signal also includes generating a quantizer input signal from the first signal and the stabilizer signal and quantizing the quantizer input signal.

In another embodiment of the present invention, a method for converting an analog signal into a digital signal includes receiving an input signal and processing the input signal using delta sigma modulation in accordance with a target transfer function $H_T$. The target transfer function $H_T$ is a function of a main loop transfer function $H_{MAIN}$ and a stabilizer loop transfer function $H_{ST}$. Processing the input signal using delta sigma modulation in accordance with a target transfer function $H_T$ further includes:

in a main loop of the delta sigma modulator:
    generating quantization feedback data from quantizer output data, wherein generating quantization feedback data from quantizer output data comprises:
        duty cycle modulating quantizer output data to generate pulse width modulated output data; and
        filtering the pulse width modulated output data with a finite impulse response filter;
    combining the input signal with the quantization feedback data to generate an input_feedback signal; and
    processing the input_feedback signal using at least one integrator to generate a main loop output signal;
in a stabilizer loop of the delta sigma modulator:
processing the quantizer output data to generate a stabilizer path output signal using a digital-to-analog converter; and
supplying the stabilizer path output signal directly to an integrator of the main loop.

Processing the input signal using delta sigma modulation in accordance with the target transfer function $H_T$ further includes combining the main loop output signal and the stabilizer path output signal to generate a main loop_stabilizer signal and generating a quantization output signal using the main loop_stabilizer signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A signal processing system includes an analog-to-digital delta sigma modulator with a duty cycle modulator and a finite impulse response (FIR) filter in a main loop feedback path of the delta sigma modulator. The duty cycle modulator and FIR filter can provide high performance filtering in the main loop feedback path. To prevent instability in the main loop caused by the duty cycle modulator and FIR filter, the delta sigma modulator also includes a stabilizer loop. Transfer functions of the main loop and the stabilizer loop combine to achieve a target transfer function for the analog-to-digital delta sigma modulator that provides for stable operation of the analog-to-digital delta sigma modulator.

In at least one embodiment, the main loop filter includes elements, such as the duty cycle modulator, that cause some processing delay. The stabilizer loop processes delta-sigma modulator quantizer output data at a rate that compensates for a relatively slow rate of processing by the main loop filter. To increase the processing rate of the stabilizer loop, in at least one embodiment, the stabilizer loop includes a stabilizer path that provides output data directly to an integrator of the main loop filter. By avoiding intermediary components, such as a summer, the stabilizer loop can process data more quickly and implementation costs can be lowered.

Figure 1:
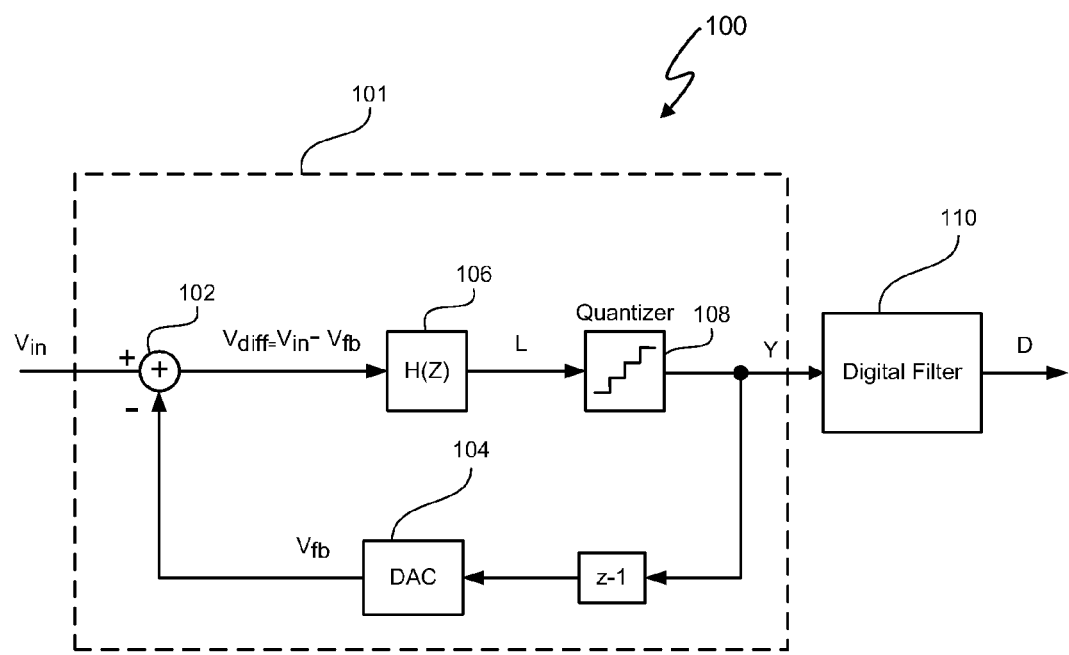
FIG. 1 (prior art) depicts an analog-to-digital delta sigma modulator.
Figure 2:
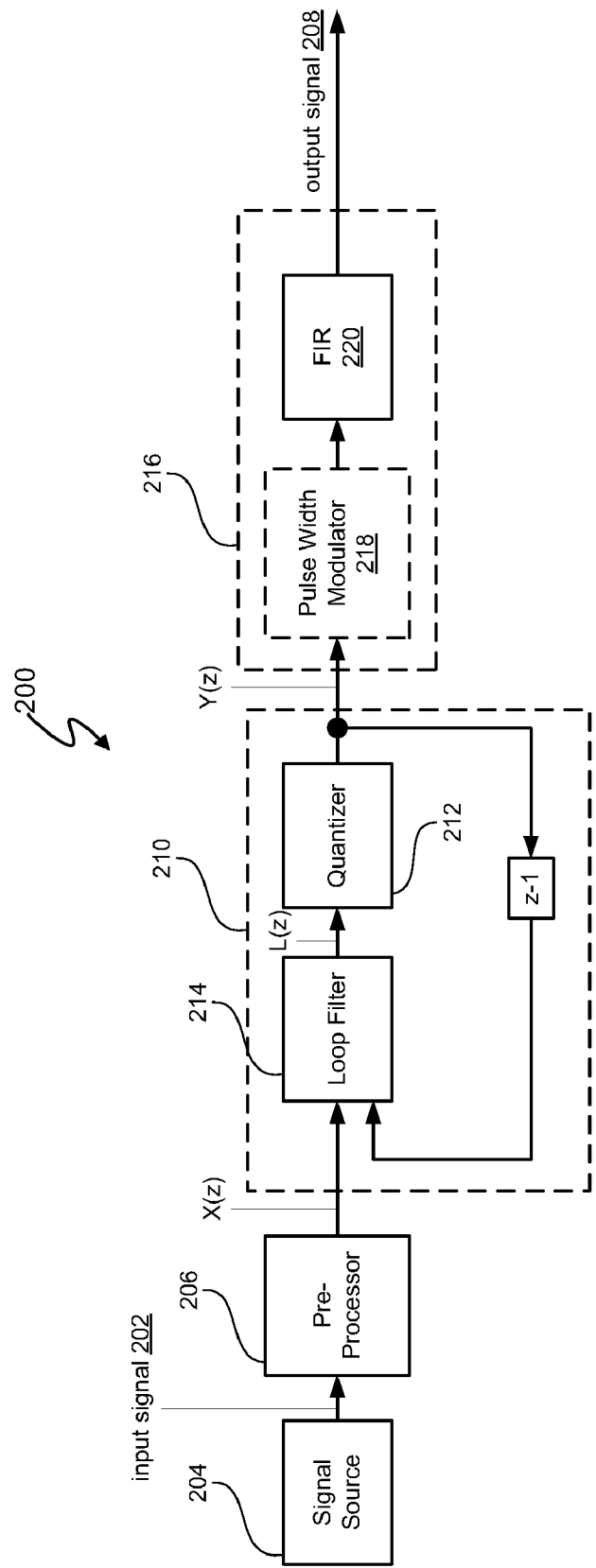
FIG. 2 (prior art) depicts a digital-to-analog delta sigma modulator signal processing system with a pulse width modulator and FIR filter post-processing filtering combination.
Figure 3:
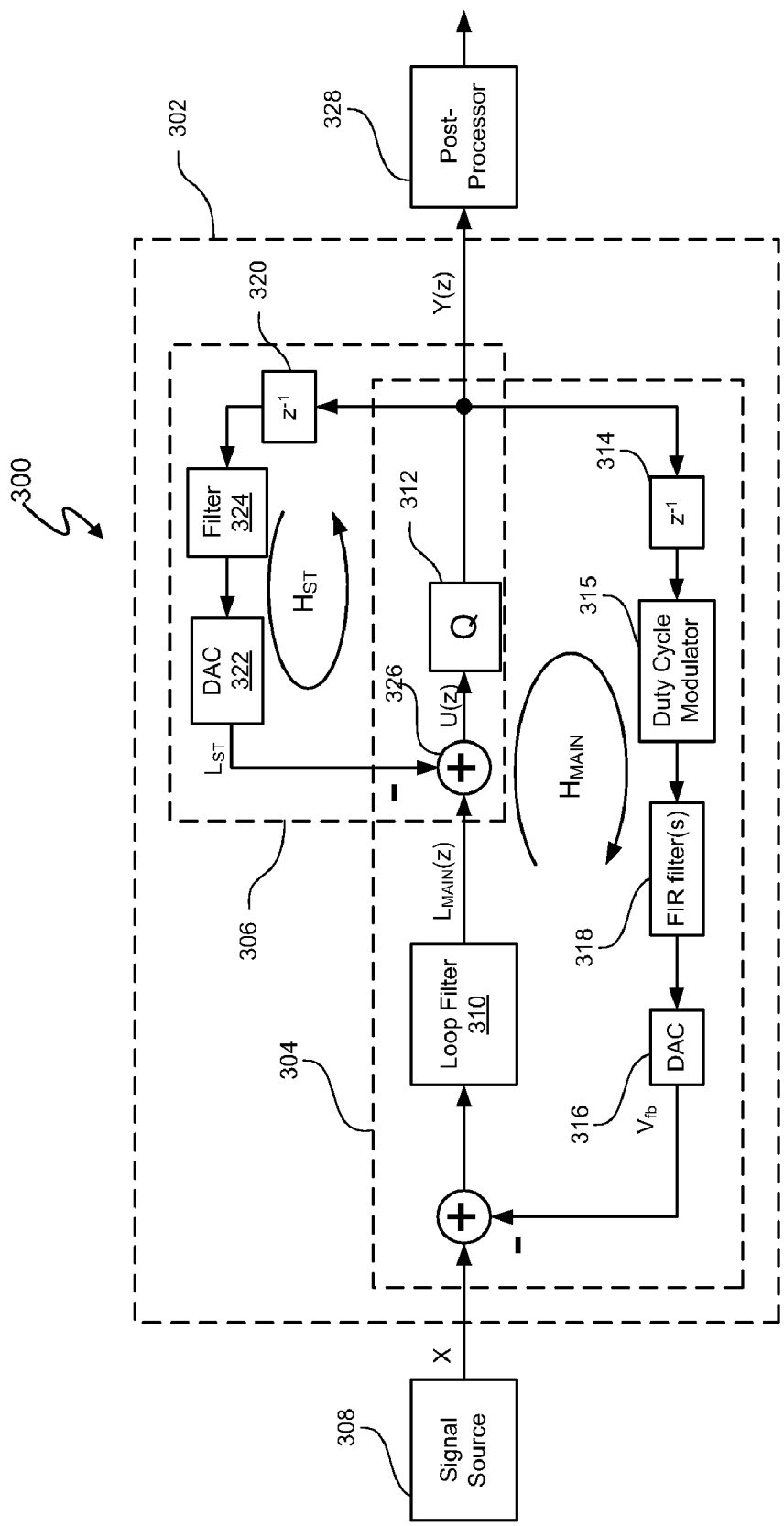
FIG. 3 depicts a signal processing system with an analog-to-digital delta sigma modulator having a main loop and a stabilizer loop.

FIG. 3 depicts a signal processing system 300 with an analog-to-digital delta sigma modulator 302 having a main loop 304 and a stabilizer loop 306. Signal source 308 can be any analog signal source, such as a microphone. In at least one embodiment, signal source 308 provides the input signal as a varying voltage. The delta sigma modulator input signal X is oversampled at a frequency that exceeds the signal band Nyquist frequency. For audio input signals, in-band frequencies are generally 0 Hz to 20 kHz. Various sampling frequencies and oversampling ratios can be used. In at least one embodiment, for an oversampling ratio of 128:1 and a sampling frequency $f_s$ equal to 48 kHz, delta sigma modulator 302 operates at a clock frequency of 6.144 MHz.

Loop filter 310 provides noise shaping for delta sigma modulator 302 by moving significant amounts of in-band noise energy present in the feedback signal $V_{fb}$ into out-of-band frequencies. The implementation of loop filter 310 is a matter of design choice and depends in part on the desired noise shaping properties of delta sigma modulator 302. An embodiment of loop filter 310 is subsequently described in more detail.

Delta sigma modulator 302 generates the feedback signal $V_{fb}$ from an output signal Y(z) of quantizer 312. Quantizer 312 represents an M-bit quantizer, where "M" is an integer greater than zero and represents the number of bits used by quantizer 312 to quantize the output signal L(z) of loop filter 310. Quantizer 312 generates a series of low resolution pulses having an average amplitude over time proportional to the sampled input signal X(z). The quantizer output signal Y(z) is fed back via a one clock cycle delay $z^{-1}$ 314 to a duty cycle modulator 315. In one embodiment, the duty cycle modulator 315 is a pulse width modulator. FIR filter(s) filters the duty cycle modulator 315 output. In one embodiment, the FIR filter(s) 318 is one (1) FIR filter implemented as a "boxcar" filter (also referred to as a "comb" filter from a frequency-domain perspective). In another embodiment, FIR filter(s) 318 is a "triangle" filter, e.g. the convolution of two (2) boxcar filters of the same or different order. The duty cycle modulator 315, FIR filter(s) 318, and DAC 316 convert the signal Y(z) $\cdot z^{-1}$ ("y(n−1)" in the time domain) into an analog signal. $V_{fb}$ with high accuracy and highly attenuated energy in out-of-band frequencies.

Duty cycle modulator 315 and FIR filter(s) 318 introduce delays in the feedback path of main loop 304 that result in insufficient out-of-band frequency gain, which can cause instability in a conventional ADC delta sigma modulator and inadequate noise shaping. The primary source of delay arises from the inherent delays of FIR filter(s) 318. Another source of delay is the length of the response of filter(s) 318

The main loop transfer function $H_{MAIN}$ includes a noise transfer function (NTF) and a signal transfer function (STF). Ideally, the NTF of delta sigma modulator 302 in the z-domain ("NTF(z)") is represented by Equation [2]:

$$NTF = \frac{1}{1 - z^{-1} \cdot H_{MAIN}}, \quad [2]$$

However, Equation [2] does not hold true with duty cycle modulator 315 and FIR filter(s) 318 in the feedback path of main loop 304.

In at least one embodiment, the delta sigma modulator 302 includes a stabilizer loop 306 having a transfer function $H_{ST}$ to achieve a target NTF represented by Equation [3]:

$$NTF = \frac{1}{1 - z^{-1} \cdot H_T},\quad [3]$$

Where transfer function $H_T$ is a target transfer function related to the main loop transfer function $H_{MAIN}$ and stabilizer loop transfer function $H_{ST}$ in accordance with Equation [4]:

$$H_T = H_{MAIN} + H_{ST} \quad [4].$$

Stabilizer loop 306 provides gain for out-of-band frequencies in the NTF of delta sigma modulator 302 to compensate for the insufficient out-of-band frequency gain of transfer function $H_{MAIN}$. Thus, stabilizer loop 306 allows delta sigma modulator 302 to implement the desirable filtering characteristics of DAC 316 and FIR filter(s) 318 and remain stable during operation. The stabilizer loop 306 operates in parallel with the main loop 304. The quantizer output signal Y(z) is fed back through a one clock cycle delay $z^{-1}$ 320 to DAC 322. In at least one embodiment, DAC 322 is a conventional digital-to-analog converter. Filter 324 filters Y(z)·$z^{-1}$, and DAC 322 converts the output of filter 324 into analog signal $L_{ST}$. Combining node 326 combines the output signal $L_{MAIN}(z)$ of loop filter 310 with the output signal $L_{ST}$ of DAC 322. In one embodiment, the polarity of output signals $L_{MAIN}(z)$ and $L_{ST}$ are such that combining node 326 sums output signals $L_{MAIN}(z)$ and $-L_{ST}$ to generate quantizer input signal U(z). Post-processor 328 (Label block 328 as "Post Processor" in FIG. 3.) further processes the quantizer output signal Y(z) to produce a digital signal in a desired format. Post-processor 328 generally includes a digital filter to provide a multi-bit output at a lower rate than the operational rate of ADC delta sigma modulator 302. In at least one other embodiment, the stabilizer loop 306 generates a digital output signal $L_{ST}$ or a combination analog and digital signal such that output signal $L_{ST}$ provides stability to delta sigma modulator 302. Additionally, the stabilizer loop 306 can be implemented after quantizer 312 or before and after quantizer 312 to provide stability to delta sigma modulator 302.

Figure 4:
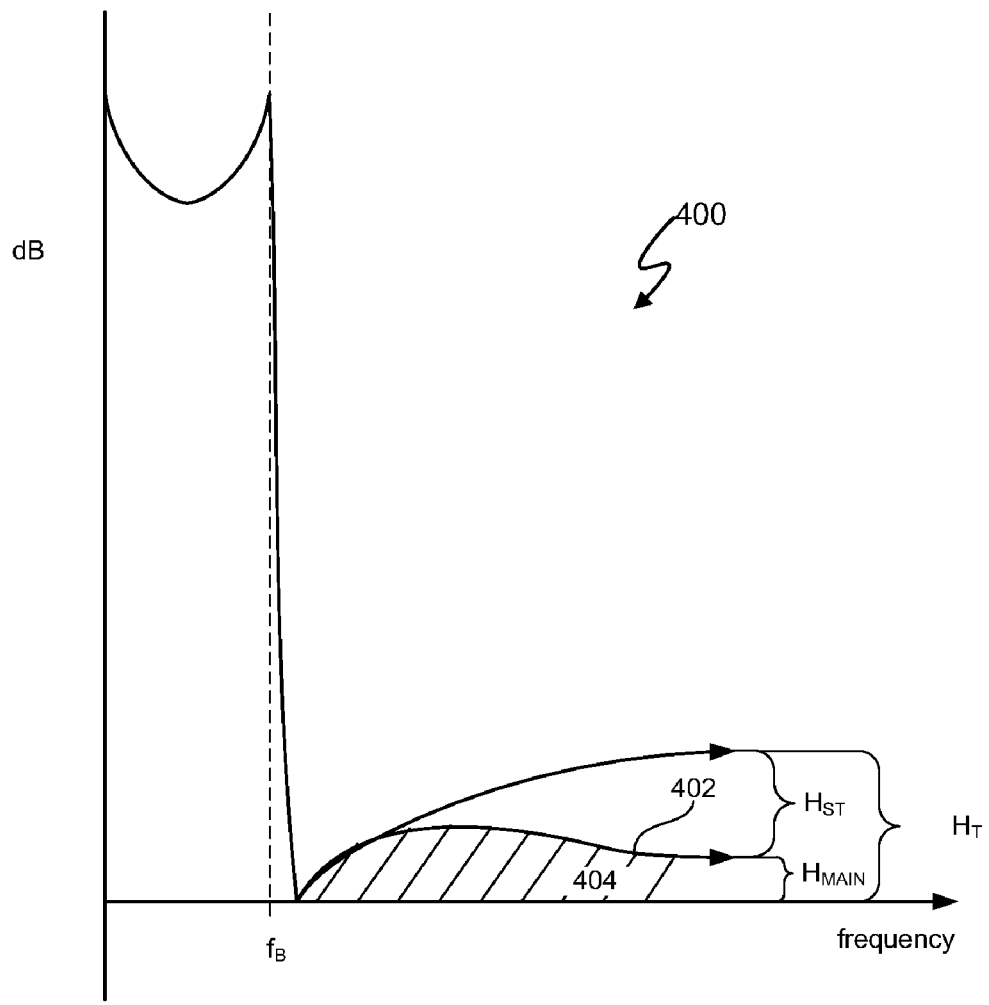
FIG. 4 depicts a frequency response of a target transfer function as a function of a main loop transfer function and a stabilizer loop transfer function.

FIG. 4 graphically depicts the frequency response 400 of the target transfer function $H_T$ as a function of main loop transfer function $H_{MAIN}$ and stabilizer loop transfer function $H_{ST}$. In at least one embodiment, the transfer function $H_{MAIN}$ has infinite gain at 0 Hz and high in-band gain, and the gain falls off sharply at the baseband frequency, $f_b$, e.g. 20 kHz. As indicated by the cross-hatched region 404, the frequency response 402 of transfer function $H_{MAIN}$ provides relatively small gain in the out-of-band frequencies, i.e. the frequencies about the baseband frequency $f_b$. In an audio context, the baseband frequency $f_b$ is approximately 20 kHz. The stabilizer loop transfer function $H_{ST}$ compensates for the low out-of-band frequency gain of main loop transfer function $H_{MAIN}$ by having a higher gain in the out-of-band frequency region. The linear combination of transfer functions $H_{MAIN}$ and $H_{ST}$ achieve the target transfer function $H_T$ as, for example, indicated in Equation [4].

Figure 5:
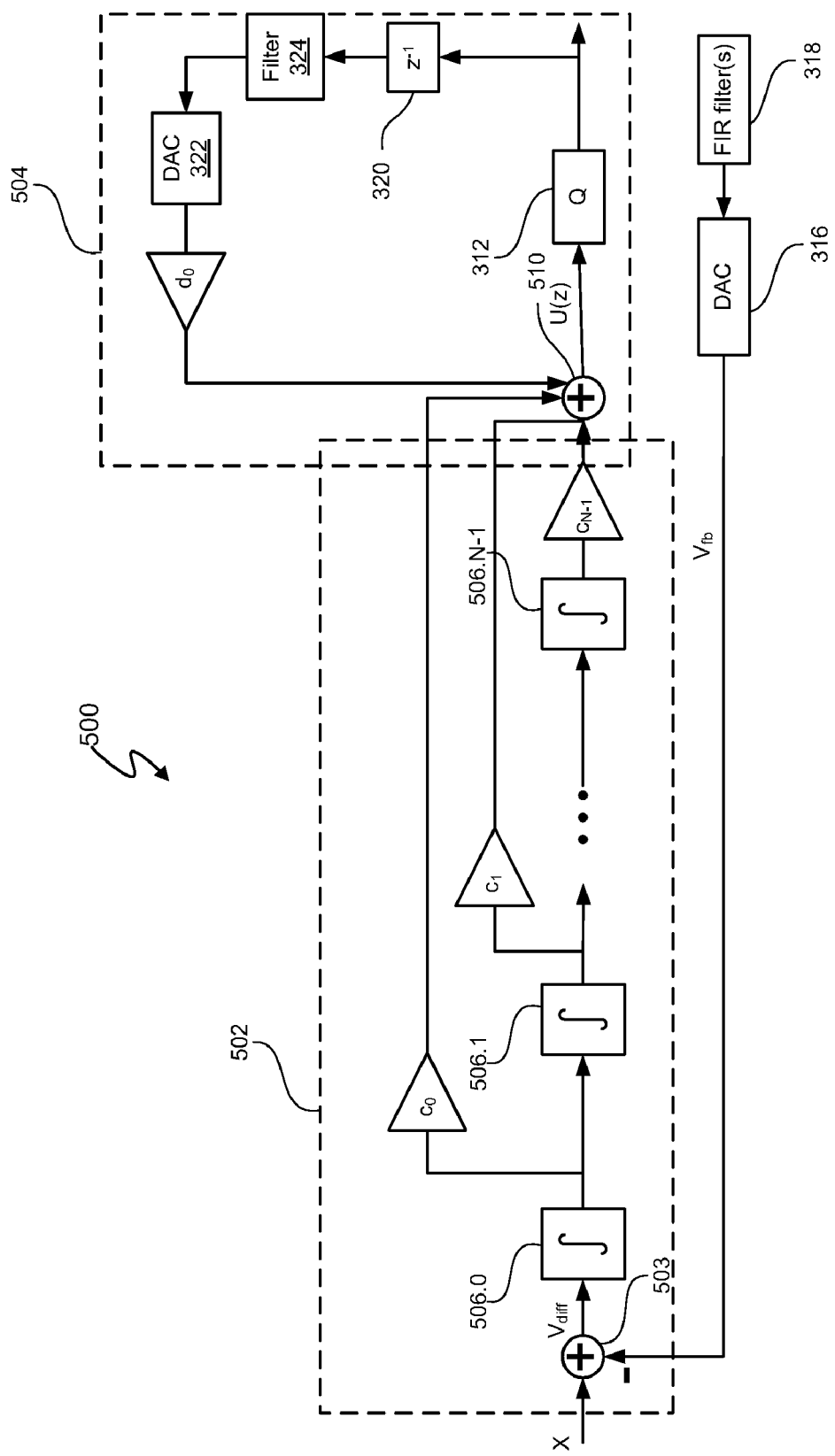
FIG. 5 depicts a main loop filter and stabilizer filter for the analog-to-digital delta sigma modulator of FIG. 3.

FIG. 5 depicts loop filter 502 and stabilizer loop 504, which represent respective embodiments of main loop filter 310 and stabilizer loop 306. The loop filter 502 includes five (5) integrators 506.0, 506.1, . . . , 506.N-1, where N is an integer and represents the order of the loop filter 502. Filter coefficients $c_i$ to obtain a desired STF and NTF can be, for example, included in the feedback loop. The feedback signal $V_{fb}$ is fed back to summer 503 and combined with analog input signal X to produce a difference signal $V_{diff}$. Integrator 506.0 integrates the difference signal $V_{diff}$. Integrators 506.1 and 506.N-1 integrate an output of the respective previous integrator 506.0 and 506.N-2. The main loop 502 also includes one or more feed forward coefficients, $c_0, c_1, \ldots, c_{N-1}$ that adjust the main loop transfer function $H_{MAIN}$ to achieve a close approximation of the target transfer function $H_T$. The determination of the value of coefficients, $c_0, c_1, \ldots, c_{N-1}$ is subsequently described in more detail.

The stabilizer loop 504 includes a DAC 322 to convert Y(z)·$z^{-1}$ into an analog signal. In at least one embodiment, DAC 322 is a pulse width modulator. In at least one embodiment, filter 324 is a $1^{st}$ order filter that can be represented by a gain $d_0$. The value of gain $d_0$ is established to allow the stabilizer loop 504 to provide out-of-band compensating gain to achieve the target transfer function $H_T$. In at least one embodiment, the main loop filter output signal $L_{MAIN}(z)$ and output signal $L_{ST}(z)$ of filter 324 are summed by summing node 510.

Figure 6:
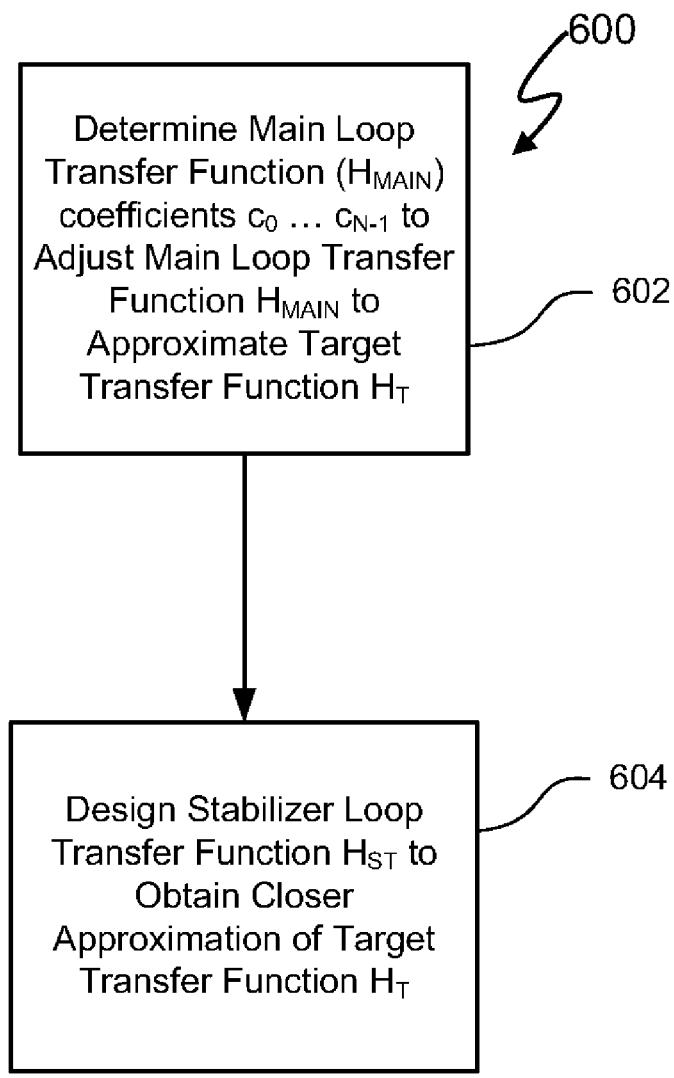
FIG. 6 depicts an analog-to-digital delta sigma modulator main loop and stabilizer loop design process.

Referring to FIGS. 3, 5, and 6, an analog-to-digital delta sigma modulator main loop and stabilizer loop design process 600 is discussed. The design process 600 applies to main loop 304 and stabilizer loop 302 but is described in the context of main loop 502 and stabilizer loop 504. Operation 602 determines the main loop transfer function $H_{MAIN}$ by, for example, determining the impulse response of each integrator 506.0 through 506.N-1 and adjusting the coefficients of $c_0$ through $c_{N-1}$ to obtain a STF and NTF that is a close approximation of a target STF and NTF.

Operation 602 adjusts the main loop transfer function $H_{MAIN}$ to approximate the target transfer function $H_T$. The characteristics of DAC 316 and FIR filter(s) 318 prevent the transfer function $H_{MAIN}$ from exactly matching the target transfer function $H_T$. However, in at least one embodiment, the coefficients, $c_0, c_1, \ldots, c_{N-1}$ are chosen so that the impulse response of $H_{MAIN}$ approximates as closely as possible the impulse response of $H_T$ for t>n1, where n1 is the length of a comb FIR filter 502.

Figure 7:
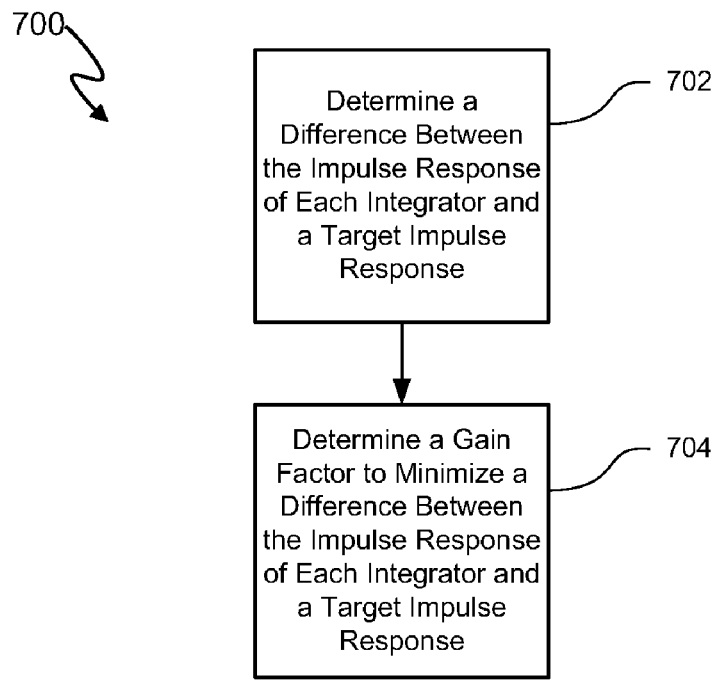
FIG. 7 depicts a main loop adjustment operation.

FIG. 7 depicts a main loop adjustment operation 700 that represents one embodiment of operation 602. Main loop adjustment operation 700 is discussed with reference to loop filter 502. Operation 702 determines respective differences between the impulse response of each integrator 506.0 through 506.N-1 and target impulse responses of target transfer function $H_T$. Operation 704 determines a gain factor $g_0$ to minimize the difference between the impulse response of each integrator 506.0 through 506.N-1 and target impulse responses of target transfer function $H_T$.

Referring to FIG. 6, operation 604 designs the stabilizer loop transfer function $H_{ST}$ so that the combination of transfer function $H_{MAIN}$ and $H_{ST}$ closely approximates or, preferably, exactly matches the target transfer function $H_T$.

Figure 8:
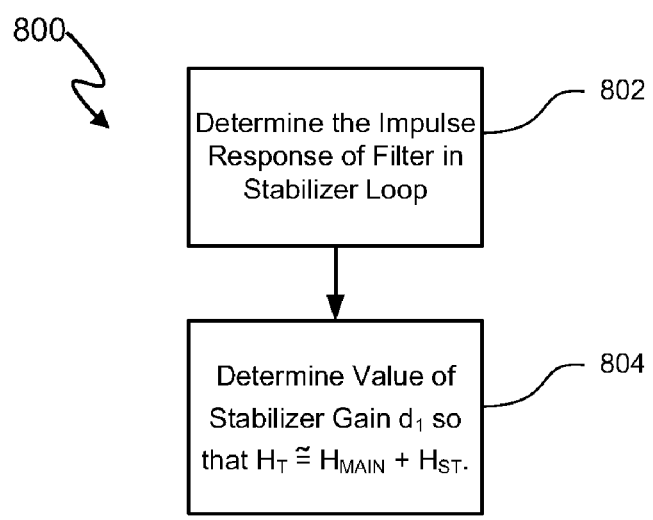
FIG. 8 depicts a stabilizer loop adjustment operation.

FIG. 8 depicts a stabilizer loop adjustment operation 800 that represents one embodiment of operation 604. Stabilizer loop adjustment operation 800 is discussed with reference to stabilizer loop 504. Operation 802 determines the impulse response of filter 324. For stabilizer loop 504, the impulse response is the gain $d_0$. Operation 804 determines the value of gain $d_0$ so that the sum of the impulse response of stabilizer loop 504 and the impulse response of loop filter 502 closely approximates or, preferably, exactly matches the target transfer function $H_T$.

Figure 9:
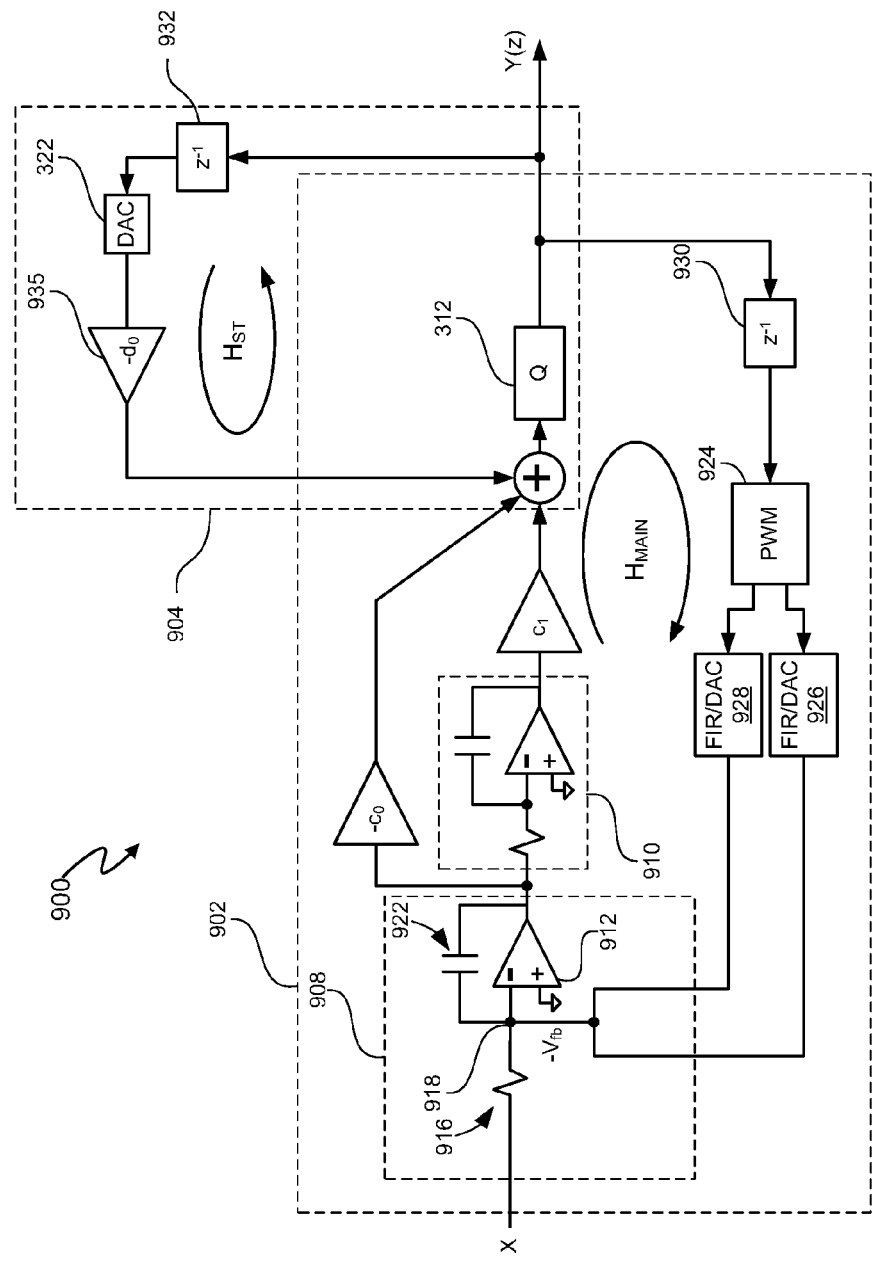
FIG. 9 depicts a second order analog-to-digital delta sigma modulator having a main loop and a stabilizer loop.

FIG. 9 depicts a second order analog-to-digital delta sigma modulator 900 having a main loop 902 and a stabilizer loop 904. Delta sigma modulator 900 represents one embodiment of delta sigma modulator 302. The loop filter of delta-sigma modulator 900 is a $2^{nd}$ order filter with two integrators 908 and 910. The analog input signal X and combined analog output signals $-V_{fb}$ of FIR/DAC 926 and FIR/DAC 928 are summed at node 918. Integrator 908 includes an operational-amplifier 912 configured as an integrator by feedback capacitor 922, resistor 916, and resistor arrays (or e.g. current source arrays) (see FIG. 10) of FIR/DAC 926 and FIR/DAC 928. Generally, each tap of FIR/DAC 926 and FIR/DAC 928 is connected to a respective resistor or current source. Integrator 910 is configured like integrator 908 to integrate the output of integrator 908. The 3-state pulse width modulator 924 provides respective output signals to FIR/DAC 926 and FIR/DAC 928. In at least one embodiment, the pulse width modulator 924 is implemented with a variable pulse width of 0 to 8. The combination of pulse width modulator 924 and FIR/DAC 926 and FIR/DAC 928 provide superb attenuation of out-of-band energy. At least one embodiment of 3-state pulse width modulator 924 is described in commonly assigned U.S. Pat. No. 6,885,330, which is hereby incorporated by reference in it entirety. Delays 930 and 932 can be implemented by a latch that delays quantizer output signal Y(z) by one clock cycle. Filter 935 is a $1^{st}$ order FIR filter.

Figure 10:
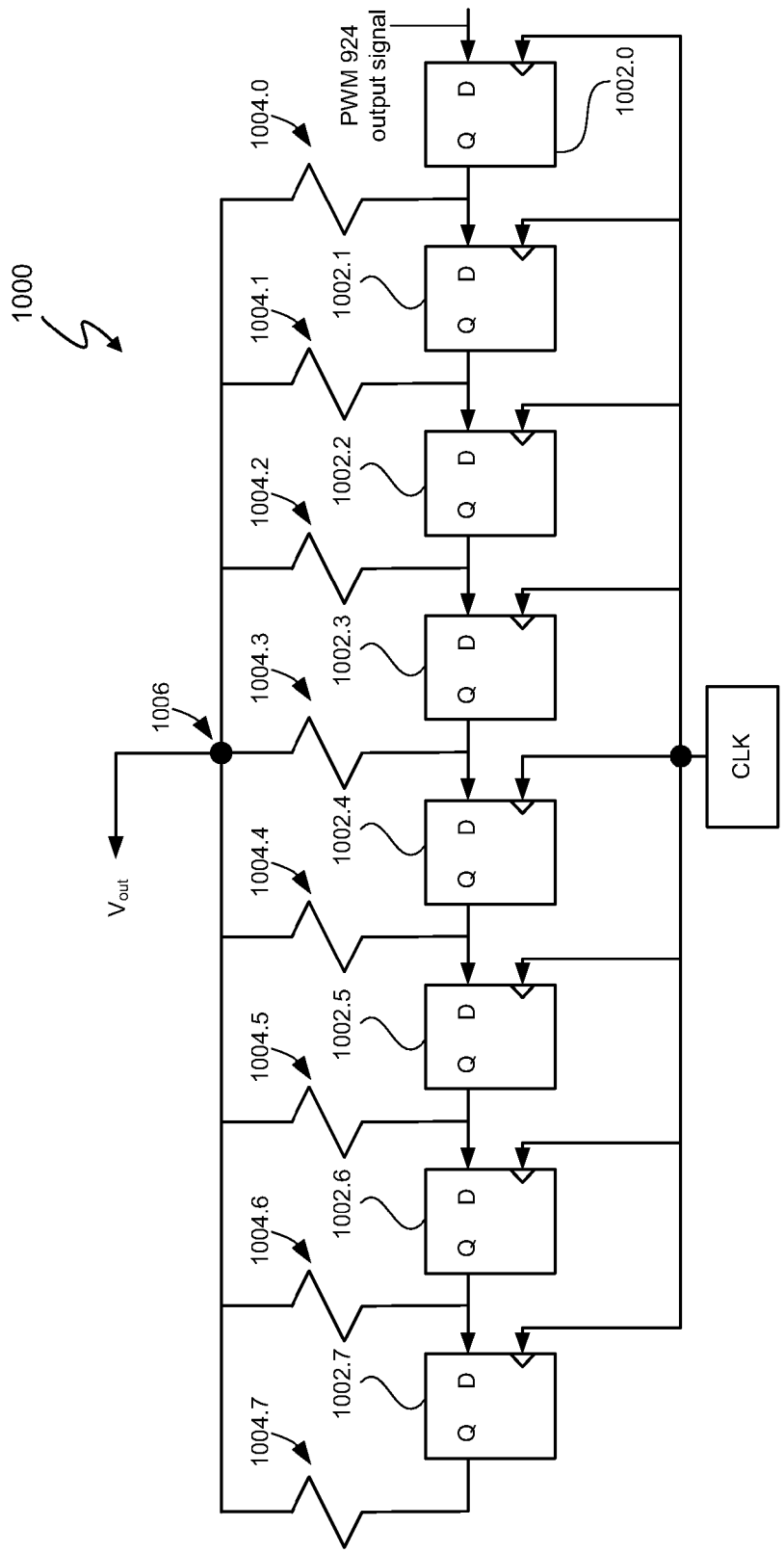
FIG. 10 depicts an 8-tap FIR filter and digital-to-analog converter from an ADC delta sigma modulator main loop feedback path.

FIG. 10 depicts an 8-tap FIR filter/digital-to-analog converter 1000, which represents one embodiment of FIR/DAC 926 and one embodiment of FIR/DAC 928. The FIR filter/digital-to-analog converter 1000 includes 8 series connected D-flip-flops 1002.0, 1002.1, . . . , 1002.7 so that the output Q or flip-flops 1002.0 . . . 1002.6 is connected to the respective D input of flip-flops 1002.1 . . . , 1002.7. The output signal of pulse width modulator 924 provides the input signal to the D input of flip-flop 1002.0. The flip-flops are clocked by a clock signal CLK having a frequency of 8 times the sampling frequency of delta sigma modulator 900. The clock signal CLK also provides the operating clock for pulse width modulator 924. The DAC portion of at least one embodiment of FIR/DAC 926 and FIR/DAC 928 is implemented by a parallel coupled resistor array of resistors 1004.0, 1004.1, . . . , 1004.7 coupled to the Q outputs of respective flip-flops 1002.0, 1002.1, . . . , 1002.7 and a common output node 1006. The output signal $V_{out}$ of FIR/DAC 926 and FIR/DAC 928 are combined with the input signal X in FIG. 9 to form the difference signal $V_{diff}$ input to operational-amplifier 912.

Referring to FIGS. 6, 7, 8, and 9, the following is an exemplary description of the determination of coefficient values $-c_0$ and $c_1$ that allow delta sigma modulator 900 to obtain a target transfer function $H_T$. In one embodiment, the target transfer function of the second order delta sigma modulator 900 is:

$$H_T(z) = H_1(z) + H_2(z) = \frac{1}{(1-z^{-1})^2} + \frac{1}{1-z^{-1}} \text{ so that}$$

$$NTF = \frac{1}{1-z^{-1} \cdot H_T} = (1-z^{-1})^2.$$

The target transfer function $H_T$ has an impulse response of vector:

$RES_{HT}=[2, 3, 4, 5, \ldots]$.

Without $-c_0$ and $c_1$ set to 1, operation 602 determines the impulse response of integrator 908 to be the vector:

$RES_{908}=[0.5625, 1, 1, 1, \ldots]$, and the impulse response of integrator 910 to be the vector:

$RES_{910}=[0.199219, 1.0625, 2.0625, 3.0625, \ldots]$.

The main loop transfer function $H_{MAIN}(z)$ impulse response vector:

$RES_{HMAIN}=-c_0 \cdot RES_{908}+c_1 RES_{910}$.

With $c_0=c_1=1$, the impulse response of $H_{MAIN}(z)$, is:

$RES_{HMAIN}=[0.761719, 2.0625, 3.0625, 4.0625, \ldots]$.

From operation 702:

$RES_{HT}-RES_{HMAIN}=[1.238281, 0.9375, 0.9375, 0.9375, \ldots]$.

Operation 704 determines that if $c_0=1.9375$, then:

$RES_{HMAIN}=[1.289, 3, 4, 5, \ldots]$.

Operation 802 determines that the impulse response of stabilizer loop 904 to be the vector:

$RES_{ST}=[d_0, 0, 0, 0, \ldots]$,

Operation 804 sets $d_0=0.75$ so that:

$RES_{HMAIN}+RES_{ST}=[1.289, 3, 4, 5 \ldots]+[0.75, 0, 0, 0, \ldots]=[2.039, 3, 4, 5, \ldots]$, which closely approximates the target transfer function $H_T$ impulse response.

Thus, to prevent instability in the main loop 304 caused by the DAC 316 and FIR filter 318 in the feedback path of main loop 304, the delta sigma modulator 302 includes a stabilizer loop 306. Transfer functions $H_{MAIN}$ and $H_{ST}$ of the respective main loop 304 and the stabilizer loop 306 combine to achieve a target transfer function $H_T$ for the analog-to-digital delta sigma modulator 302 that provides for stable operation of the analog-to-digital delta sigma modulator 302.

Figure 11:
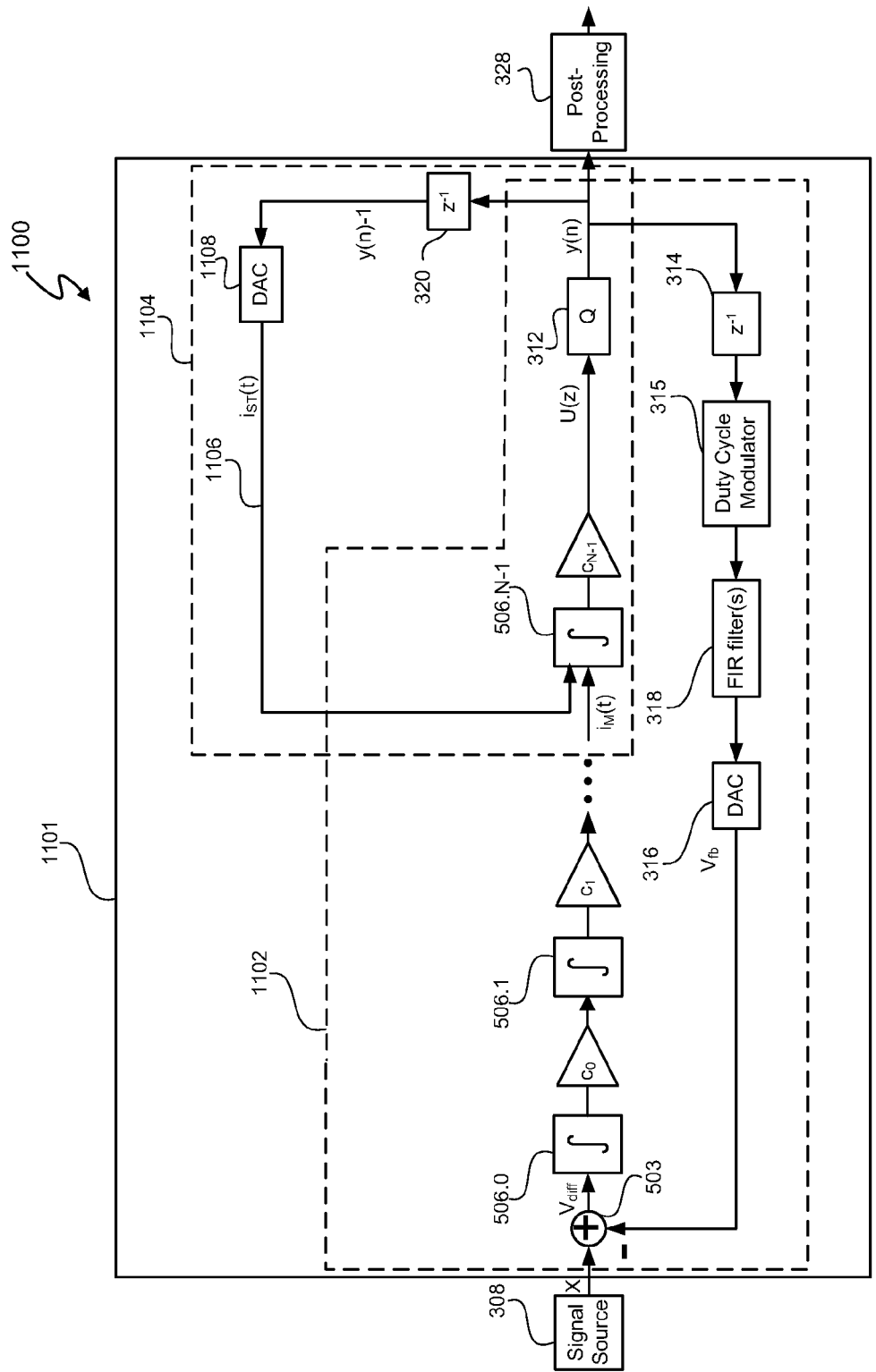
FIG. 11 depicts analog-to-digital delta-sigma modulator with a main loop filter and a stabilizer path for having a direct output to a main loop filter integrator.

FIG. 11 depicts a signal processing system 1100. Signal processing system 1100 includes an analog-to-digital delta-sigma modulator 1101 having a main loop 1102 and stabilizer loop 1104. The main loop 1102 includes a number of delays that reduce the processing rate of the main loop 1102 and contribute to potential instability in the main loop 1102. For example, in at least one embodiment, the duty cycle modulator 315 supplies an analog pulse-width modulated signal commensurate with the digital output y(n) of quantizer 312. The duty cycle modulator 315 represents one source of processing delay. Additionally, each of integrators 506.0, 506.1, . . . , 506.N-1 include further processing delays.

Performance of delta-sigma modulator 1101 in compensating for delays and, thus, low out-of-bound signal gain, can be enhanced by increasing the processing speed of stabilizer loop 1104. The processing speed of stabilizer loop 1104 can be increased and overall component costs can be decreased by supplying an output signal that can be combined directly with a main loop signal without using summing components. The stabilizer loop 1104 includes a stabilizer path 1106. In at least one embodiment, the stabilizer path 1106 begins at the output of quantizer 312 and ends at the output of DAC 1108. The DAC 1108 generates an analog output signal $i_{ST}(t)$ commensurate with the delayed, digital quantizer output signal y(n-1). DAC 1108 supplies output signal $i_{ST}(t)$ directly to integrator 506.N-1 of main loop 1102 without using a summer such as the summer represented by summing node 510. In other embodiments, the stabilizer path 1106 output signal $i_{ST}(t)$ is provided to one or more integrators of main loop 1102 other than, or in addition to, integrator 506.N-1. Eliminating the summing node 510 increases the processing speed of stabilizer loop 1104 and reduces overall component costs of delta-sigma modulator 1101.

Figure 12:
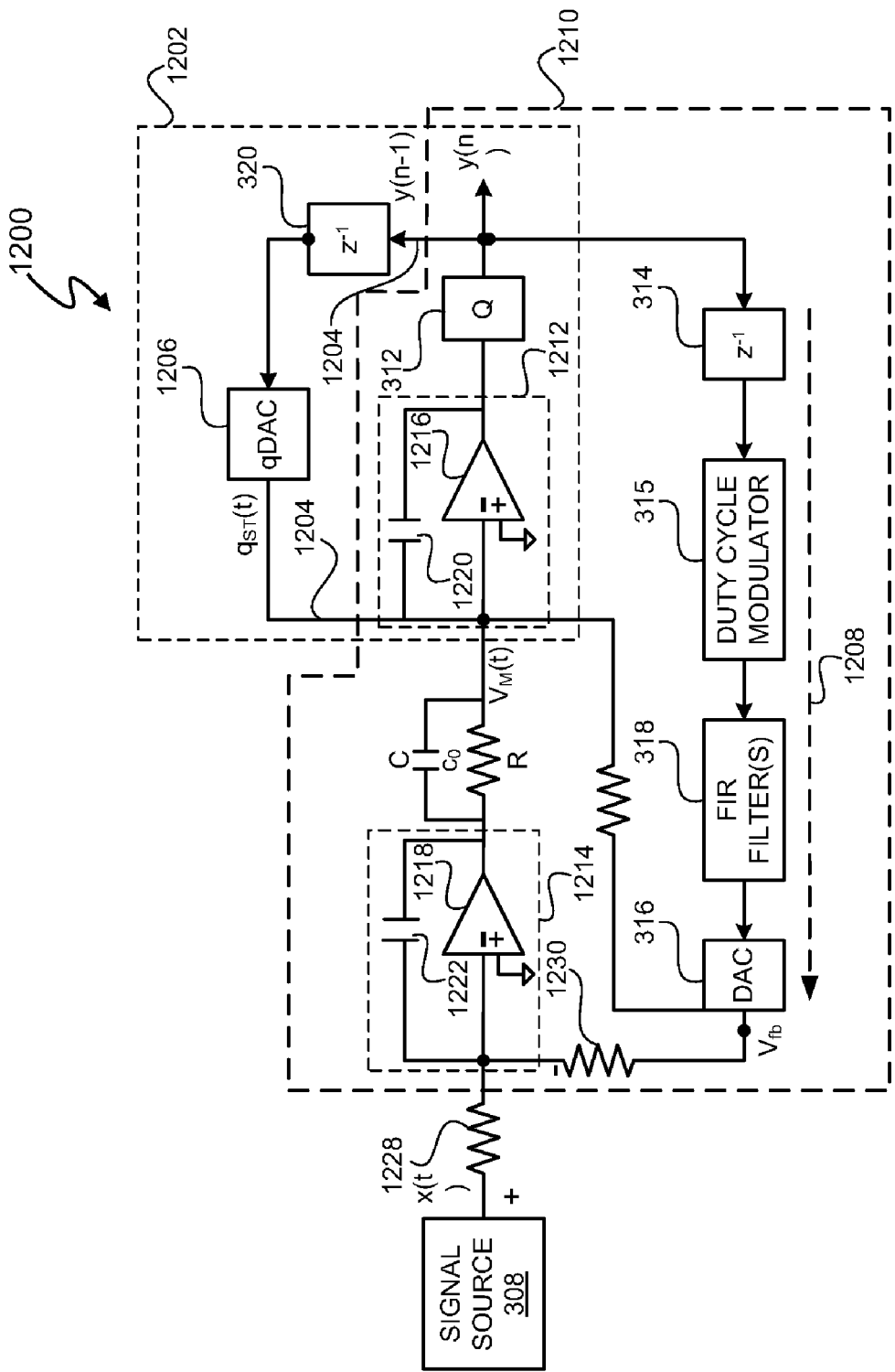
FIG. 12 depicts a main loop filter and stabilizer loop for the delta-sigma modulator of FIG. 11.

FIG. 12 depicts delta-sigma modulator 1200, which represents one embodiment of delta-sigma modulator 1101. The delta-sigma modulator 1200 includes a stabilizer loop 1202, and the stabilizer loop 1202 includes a stabilizer path 1204. In at least one embodiment, the stabilizer path 1204 begins at the output of quantizer 312 and ends at the output of charge digital-to-analog converter (qDAC) 1206. The qDAC 1206 (described in more detail in FIG. 13) directly converts the delayed, digital quantizer output signal y(n−1) into a charge having an analog voltage magnitude that is commensurate with the digital value of the quantizer output signal y(n−1). The digital-to-analog conversation rate of qDAC 1206 is very fast relative to the digital-to-analog conversion rate of the quantizer output signal feedback path 1208 of main loop 1210.

To further improve the speed performance of stabilizer loop 1202, an output of qDAC 1206 is connected directly to an input of integrator 1212. Integrator 1212 is configured to directly process signals from stabilizer loop 1202 and main loop 1210 without a summing node, such as summing node 510 in FIG. 5. In the embodiment of delta-sigma modulator 1200, integrators 1212 and 1214 are configured using respective operational amplifiers 1216 and 1218 and respective feedback capacitors 1220 and 1222 connected to respective inverting terminals (labeled as "−") of operational amplifiers 1216 and 1218. The non-inverting terminals (labeled as "+") are connected to ground. Integrator 1212 can be reconfigured in any way that allows a direct connection to the output of stabilizer 1202 and omits a summing node, such as summing node 510 in FIG. 5. The resistors 1228 and 1230 provide input resistance to input signal x(t) and main loop feedback signal $V_{fb}$ so that integrator 1214 integrates the difference signal $x(t)-V_{fb}$. The difference signal $x(t)-V_{fb}$ represents a main loop stabilizer signal. In at least one embodiment, the main loop feedback signal $V_{fb}$ is also fed back to the input of integrator 1212.

The delta-sigma modulator 1200 implements the main loop filter coefficient $c_0$ using a parallel connected resistor/capacitor pair R/C. The values of the resistor/capacitor R/C combination determine the value of coefficient $c_0$. Operations 600 and 700 can be used to determine the values of the resistor/capacitor R/C pair by adjusting the values of the resistor/capacitor R/C pair to determine a gain factor to minimize a difference between the impulse response of each integrator and a target impulse response as discussed in conjunction with operation 704 (FIG. 7). In at least one embodiment, the order of delta-sigma modulator 1200 can be increased by adding integrators and resistor/capacitor pairs and determining the values of the resistor/capacitor pairs in accordance with operations 600 and 700.

Thus, the stabilizer loop 1202 is able to provide high frequency gain as illustratively depicted in FIG. 4. The stabilizer loop 1202 also provides stability for delta-sigma modulator 1200 and allows the main loop 1210 to include the duty cycle modulator 315 and FIR filter(s) 318.

Figure 13:
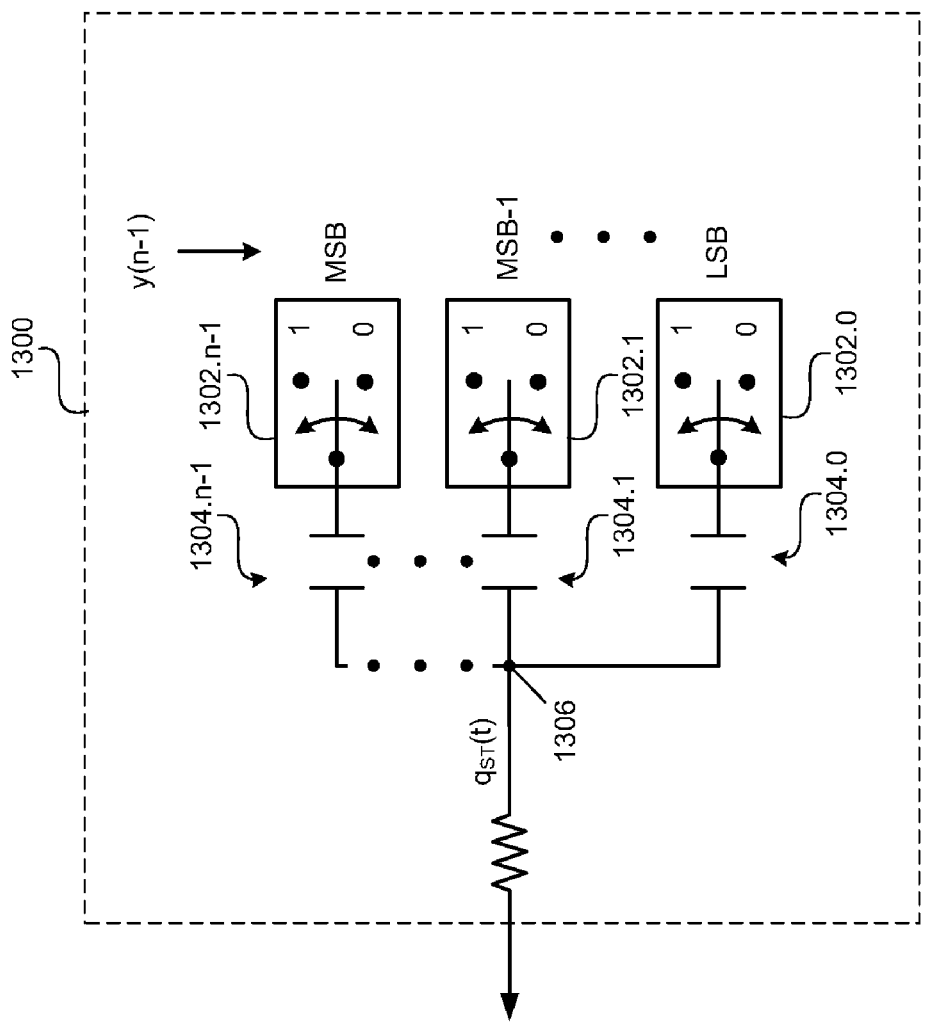
FIG. 13 depicts a current digital-to-analog converter.

FIG. 13 depicts qDAC 1300 that represents one embodiment of qDAC 1206. The input signal y(n−1) to qDAC is the delayed, digital output signal of quantizer 312. Input signal y(n−1) is an n-bit signal, and n is a positive integer. For example, if quantizer 312 has a 2-bit output, n is 2, if quantizer 312 has a 3-bit, n is 3, and so on. In at least one embodiment, qDAC 1300 is a binary-weighted digital-to-analog converter. Thus, qDAC 1300 includes n switches 1302.0, 1302.1, . . . , 1303.n−1 g representing respectively the least significant bit (LSB), the next LSB, . . . , and the most significant bit (MSB) of input signal y(n−1). Switches 1302.0, 1302.1, . . . , 1303.n−1 connect either a logical 1 voltage or a logical 0 voltage to respective capacitors 1304.0, 1304.1, . . . , 1304.n−1. The logical values respectively connected to each of capacitors 1304.0, 1304.1, . . . , 1304.n-1 correlates with the logical value of the LSB, next LSB, . . . , and the MSB of input signal y(n−1). In at least one embodiment, before each cycle of quantizer 312, capacitors 1304.0, 1304.1, . . . , 1304.n-1 are discharged by connecting both terminals of each capacitor to ground.

The total charge $q_{ST}(t)$ on capacitors 1304.0, 1304.1, . . . , 1304.n−1 at time t represents an analog voltage at node 1306 commensurate with the digital value of input signal y(n−1). The total charge $q_{ST}(t)$ plus the output voltage $V_M(t)$ of the main loop filter resistor/capacitor pair R/C plus the feedback voltage $V_{fb}$ are sensed as an input voltage to integrator 1212 without using a summer. The values of capacitors 1304.0, 1304.1, . . . , 1304.n−1 are a matter of design choice. The particular design of qDAC 1300 is also a matter of design choice. For example, qDAC 1300 can be designed as a thermometer coded digital-to-analog converter, a segmented digital-to-analog converter, etc.

In at least one embodiment, DAC 316 is also a current digital-to-analog converter with the same topology as qDAC 1300. In at least one embodiment, a single current digital-to-analog converter performs the functions of both DAC 316 and qDAC 1300. The input signal y(n−1) and output signal of the FIR filter(s) 318 can be multiplexed into the single qDAC, and the single qDAC can provide both output signals $i_{ST}(t)$ and $V_{fb}$.

Although the present invention has been described in detail, it should be understood that various changes, substitutions and alterations can be made hereto without departing from the spirit and scope of the invention as defined by the appended claims.

What is claimed is:

1. A signal processing system comprising an analog-to-digital converter, the analog-to-digital converter comprising:
a main loop filter having a transfer function $H_{MAIN}$, the main loop filter comprising:
a signal input to receive an input signal;
a quantizer;
a first digital-to-analog converter coupled to the quantizer, the first digital-to-analog converter comprising a duty cycle modulator;
a finite impulse response filter coupled to the first digital-to-analog converter;
a first integrator coupled to the signal input, to an output of the finite impulse response filter, and to an input of the quantizer;
a second integrator coupled between the first integrator and the quantizer; and
a stabilizer loop having a transfer function $H_{ST}$, wherein the stabilizer loop includes a stabilizer path and the stabilizer path includes (i) an input coupled to an output of the quantizer and (ii) an output connected directly to an input of the second integrator;
wherein a target transfer function of the analog-to-digital converter is $H_T$, and $H_T$ comprises a combination of $H_{MAIN}$ and $H_{ST}$.

2. The signal processing system of claim 1 wherein the combination of $H_{MAIN}$ and $H_{ST}$ comprises $H_{MAIN}+H_{ST}$.

3. The signal processing system of claim 1 wherein:
the main loop filter further comprises a second digital-to-analog converter coupled to the finite impulse response filter; and
the stabilizer path comprises:
a third digital-to-analog converter coupled to the input of the stabilizer path; and a charge transfer device coupled to the second digital-to-analog converter and connected to the input of the second integrator.

4. The signal processing system of claim 3 wherein the charge transfer device comprises at least one capacitor.

5. The signal processing system of claim 3 wherein the second digital-to-analog converter and the third digital-to-analog converter are a single digital-to-analog converter and the single digital-to-analog converter provides a first digital-to-analog output signal for the main loop filter and a separate second digital-to-analog output signal for the stabilizer path.

6. The signal processing system of claim 3 wherein the first and second digital-to-analog converters are current digital-to-analog converters.

7. The signal processing system of claim 1 wherein the duty cycle modulator comprises a pulse width modulator.

8. The signal processing system of claim 1 wherein the target transfer function $H_T$ includes a noise transfer function and a signal transfer function, and the noise transfer function (NTF) has the general form of:

$$NTF = \frac{1}{1 - z^{-1} \cdot H_T}.$$

9. The signal processing system of claim 1 wherein the input signal comprises an audio signal.

10. The signal processing system of claim 1 wherein the delta sigma modulator and filter are implemented using code stored in a memory and executable by a processor.

11. A signal processing system comprising an analog-to-digital converter having a target transfer function of $H_T$, the analog-to-digital converter comprising:
a delta sigma modulator comprising:
a quantizer to generate quantizer output data;
a main loop filter to process input data and quantization feedback data in accordance with a transfer function $H_{main}$, wherein the main loop filter comprises components for:
receiving the input data;
generating the quantization feedback data from the quantizer output data using (i) pulse width modulation to generate pulse width modulated output data and (ii) finite impulse response filtering of the pulse width modulated output data;
combining the input signal with the quantization feedback data to generate an input_feedback signal; and
processing the input_feedback signal using at least one integrator;
an integrator coupled to the quantizer; and
a stabilizer loop having a transfer function $H_{ST}$, wherein the stabilizer loop includes a stabilizer path, connected to the integrator, to process the quantizer output data and the stabilizer path comprises components to:
receive the quantizer output data to generate stabilizer path output data; and
supply the stabilizer path output data directly to the integrator;
wherein the target transfer function $H_T$ comprises a combination of transfer functions $H_{MAIN}$ and $H_{ST}$.

12. The signal processing system of claim 11 wherein the combination of transfer functions $H_{MAIN}$ and $H_{ST}$ comprises $H_{MAIN} + H_{ST}$.

13. The signal processing system of claim 11 wherein the stabilizer path comprises components for:
converting the quantizer output data from digital data to analog data using at least one charge transfer device to provide high frequency gain in a noise transfer function of the main loop filter.

14. The signal processing system of claim 13 wherein the charge transfer device comprises at least one capacitor.

15. The signal processing system of claim 11 wherein the target transfer function $H_T$ includes a noise transfer function and a signal transfer function, and the noise transfer function (NTF) has the general form of:

$$NTF = \frac{1}{1 - z^{-1} \cdot H_T},$$

wherein $z^{-1}$ represents a delay.

16. The signal processing system of claim 11 wherein the component for combining the input signal with the quantization feedback data to generate an input_feedback signal comprises a component for determining a difference between the quantization feedback data and the input_feedback signal.

17. A method for converting an analog input signal into a digital output signal, the method comprising:
converting the analog input signal into the digital output signal using a delta sigma modulator having a target transfer function $H_T$, wherein the delta sigma modulator includes a main loop having a transfer function $H_{MAIN}$ and a stabilizer loop having a transfer function $H_{ST}$, and the target transfer function $H_T$ comprises a combination of transfer functions $H_{MAIN}$ and $H_{ST}$;
wherein converting the analog input signal comprises:
determining a first signal from the analog input signal using the main loop of a delta sigma modulator, wherein the main loop includes (i) a quantizer feedback path comprising a duty cycle modulator coupled to a first finite impulse response filter and (ii) a signal path comprising an integrator;
determining a stabilizer signal using the stabilizer loop of the delta sigma modulator, wherein the stabilizer loop includes a stabilizer path coupled across a quantizer of the delta sigma modulator and the stabilizer path includes a digital-to-analog converter and an output connected directly to the integrator of the main loop;
generating a quantizer input signal from the first signal and the stabilizer signal; and
quantizing the quantizer input signal.

18. The method of claim 17 wherein the combination of transfer functions $H_{MAIN}$ and $H_{ST}$ comprises $H_{MAIN} + H_{ST}$.

19. A method for converting an analog signal into a digital signal, the method comprising:
receiving an input signal;
processing the input signal using delta sigma modulation in accordance with a target transfer function $H_T$, wherein the target transfer function $H_T$ is a function of a main loop transfer function $H_{MAIN}$ and a stabilizer loop transfer function $H_{ST}$, wherein processing the input signal using delta sigma modulation in accordance with the target transfer function $H_T$ further comprises:
in a main loop of the delta sigma modulator:
generating quantization feedback data from quantizer output data, wherein generating quantization feedback data from quantizer output data comprises:
duty cycle modulating quantizer output data to generate pulse width modulated output data; and filtering the pulse width modulated output data with a finite impulse response filter;

combining the input signal with the quantization feedback data to generate an input_feedback signal; and processing the input_feedback signal using at least one integrator to generate a main loop output signal;

in a stabilizer loop of the delta sigma modulator:

processing the quantizer output data to generate a stabilizer path output signal using a digital-to-analog converter; and supplying the stabilizer path output signal directly to an integrator of the main loop; and combining the main loop output signal and the stabilizer path output signal to generate a main loop_stabilizer signal; and generating a quantization output signal using the main loop_stabilizer signal.

20. The method of claim 19 wherein combining the main loop output signal and the stabilizer feedback signal comprises adding the main loop output signal and the stabilizer feedback signal.

21. The method of claim 19 wherein processing the quantizer output data to generate a stabilizer feedback signal using a digital-to-analog converter comprises:

converting the quantizer output data from digital data to analog data; and providing the analog data as the stabilizer feedback signal directly to the integrator of the main loop.

22. The method of claim 19 wherein the input data comprises an audio signal.

23. A signal processing system comprising:

an analog-to-digital converter, the analog-to-digital converter comprising:

a main loop filter having a transfer function $H_{MAIN}$, the main loop filter comprising:

a signal input to receive an input signal;

a quantizer;

a pulse width modulator coupled to an output of the quantizer;

a finite impulse response filter coupled to the first digital-to-analog converter;

a digital-to-analog converter coupled to an output of the finite impulse response filter; and a first integrator coupled to the signal input, to an output of the digital-to-analog converter, and to an input of the quantizer;

a second integrator coupled between the first integrator and the quantizer; and a stabilizer loop having a transfer function $H_{ST}$, wherein the stabilizer loop includes a stabilizer path and the stabilizer path includes (i) an input coupled to an output of the quantizer and (ii) an output coupled to an input of the second integrator;

wherein a target transfer function of the analog-to-digital converter is $H_T$, and $H_T$ comprises a combination of $H_{MAIN}$ and $H_{ST}$.

* * * * *